US012648223B2

(12) United States Patent
Wang et al.

(10) Patent No.: US 12,648,223 B2
(45) Date of Patent: Jun. 2, 2026

(54) DISPLAY PANEL AND DISPLAY DEVICE HAVING DIFFERENT DOPED CHANNEL REGIONS

(71) Applicant: WUHAN CHINA STAR OPTOELECTRONICS SEMICONDUCTOR DISPLAY TECHNOLOGY CO., LTD., Wuhan (CN)

(72) Inventors: Wei Wang, Wuhan (CN); Qing Huang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 402 days.

(21) Appl. No.: 18/288,968

(22) PCT Filed: Jun. 29, 2023

(86) PCT No.: PCT/CN2023/104235
§ 371 (c)(1),
(2) Date: Oct. 30, 2023

(87) PCT Pub. No.: WO2024/131020
PCT Pub. Date: Jun. 27, 2024

(65) Prior Publication Data
US 2024/0213256 A1 Jun. 27, 2024

(30) Foreign Application Priority Data
Dec. 22, 2022 (CN) .......................... 202211657483.3

(51) Int. Cl.
*H10D 86/40* (2025.01)
*H01L 25/16* (2023.01)
(Continued)

(52) U.S. Cl.
CPC ......... *H10D 86/421* (2025.01); *H01L 25/167* (2013.01); *H10D 62/299* (2025.01); *H10D 86/60* (2025.01)

(58) Field of Classification Search
CPC .... H01L 25/167; H10D 62/17; H10D 30/017; H10D 30/019–0198; H10D 30/031;
(Continued)

(56) References Cited

U.S. PATENT DOCUMENTS

2005/0062053 A1 3/2005 Chen
2022/0005904 A1* 1/2022 Moon .................. H10D 30/673

FOREIGN PATENT DOCUMENTS

CN 1725513 A 1/2006
CN 104900708 A 9/2015
(Continued)

OTHER PUBLICATIONS

PCT International Search Report for International Application No. PCT/CN2023/104235, mailed on Sep. 19, 2023, 11pp.
(Continued)

*Primary Examiner* — Cheung Lee
(74) *Attorney, Agent, or Firm* — The Roy Gross Law Firm, LLC; Roy D. Gross

(57) ABSTRACT

A display panel and a display device. The display panel includes a power supply high-voltage signal line, a driving thin film transistor, and a light emitting element. The driving thin film transistor comprises an active layer. The active layer includes a source region, a drain region, and a channel region. The source region is connected to the power supply high-voltage signal line. The drain region is connected to the light emitting element. A part of the channel region close to the drain region has a lower majority carrier concentration than a part of the channel region close to the source region.

20 Claims, 7 Drawing Sheets

(51) Int. Cl.
H10D 62/17 (2025.01)
H10D 86/60 (2025.01)

(58) Field of Classification Search
CPC ........... H10D 30/0312; H10D 30/0318; H10D 62/213; H10D 62/228; H10D 62/299; H10D 62/605; H10D 86/00; H10D 86/421; H10D 86/60; H10K 50/805; H10K 59/00; H10K 59/10; H10K 59/12; H10K 59/805
See application file for complete search history.

(56) References Cited

FOREIGN PATENT DOCUMENTS

| | | | |
|----|-------------|---|---------|
| CN | 105826370 A | | 8/2016 |
| CN | 106024629 A | | 10/2016 |
| CN | 111710728 A | | 9/2020 |
| CN | 115050836 A | | 9/2022 |
| CN | 115985944 A | | 4/2023 |

OTHER PUBLICATIONS

PCT Written Opinion of the International Searching Authority for International Application No. PCT/CN2023/104235, mailed on Sep. 19, 2023, 9pp.

\* cited by examiner

1

DISPLAY PANEL AND DISPLAY DEVICE HAVING DIFFERENT DOPED CHANNEL REGIONS

CROSS REFERENCE TO RELATED APPLICATIONS

This application is a National Phase of PCT Patent Application No. PCT/CN2023/104235 having International filing date of Jun. 29, 2023, which claims the benefit of priority of Chinese Patent Application No. 202211657483.3, filed Dec. 22, 2022, the contents of which are all incorporated herein by reference in their entirety.

FIELD OF INVENTION

The present disclosure relates to a field of display technology, and particularly to a display panel and a display device.

BACKGROUND

Organic Light Emitting diode (OLED) display panels have been widely used in people's lives, such as display screens for mobile phones, computers, etc. With development of display technology, people have higher requirements for display quality and power consumption of display panels.

SUMMARY

The power consumption of the display panels mainly includes power consumption of driving thin film transistors, power consumption of light emitting elements, and thermal consumption of metal traces. The driving thin film transistors generate heat when operating, and thermal consumption of a single driving thin film transistor may be simply calculated as: $W_{DTFT} = I_{ds} * V_{ds}$, where $W_{DTFT}$ is the thermal consumption of the driving thin film transistor, $I_{ds}$ is a drain-source current, and $V_{ds}$ is a drain-source voltage. When a driving thin film transistor drives a light emitting element to emit light, in order to ensure stability of an output current, a drain-source voltage $V_{ds}$ of the driving thin film transistor should be slightly greater than a saturation voltage. If the saturation voltage of the driving thin film transistor is greater, the drain-source voltage $V_{ds}$ must be increased to make it greater than the saturation voltage, which will increase thermal consumption of the driving thin film transistor, resulting in an increase in power consumption of a display panel.

Current display panels have a problem of large power consumption of the display panels due to large saturation voltages of driving thin film transistors. Therefore, it is necessary to provide a display panel and display device to improve this defect.

Embodiments of the present disclosure provide a display panel and a display device that can reduce saturation voltages of driving thin film transistors, and reduce power consumption of the driving thin film transistors, thereby reducing power consumption of the display panel.

The embodiments of the present disclosure provide a display panel comprising a power supply high-voltage signal line, a driving thin film transistor, and a light emitting element. The driving thin film transistor comprises an active layer. The active layer includes a source region, a drain region, and a channel region. The channel region is disposed between the source region and the drain region. The source region is electrically connected to the power supply high-voltage signal line. The drain region is electrically connected to the light emitting element.

A part of the channel region close to the drain region has a lower doping ion concentration than a part of the channel region close to the source region.

According to one embodiment of the present disclosure, the channel region comprises a first sub-channel region and a second sub-channel region, and the second sub-channel region is disposed between the first sub-channel region and the drain region.

The second sub-channel region has a lower doping ion concentration than the first sub-channel region.

According to one embodiment of the present disclosure, the first sub-channel region and the second sub-channel region have a same doping type.

According to one embodiment of the present disclosure, a doping type of the first sub-channel region is different from a doping type of the second sub-channel region.

According to one embodiment of the present disclosure, the first sub-channel region is N-type doped or P-type doped, and the second sub-channel region is undoped.

According to one embodiment of the present disclosure, the doping type of the first sub-channel region is same as a doping type of the source region and the drain region, and a doping ion concentration of the first sub-channel region is less than a doping ion concentration of the source region and the drain region.

According to one embodiment of the present disclosure, a length of the first sub-channel region is greater than or equal to a length of the second sub-channel region.

According to one embodiment of the present disclosure, a width of the first sub-channel region is greater than or equal to a width of the second sub-channel region.

According to one embodiment of the present disclosure, the channel region further comprises a third sub-channel region, and the third sub-channel region is disposed between the first sub-channel region and the second sub-channel region.

The first sub-channel region, the second sub-channel region, and the third sub-channel region have a same doping type, a doping ion concentration of the first sub-channel region is greater than a doping ion concentration of the third sub-channel region, and the doping ion concentration of the third sub-channel region is greater than the doping ion concentration of the second sub-channel region.

According to one embodiment of the present disclosure, the channel region further comprises a third sub-channel region, and the third sub-channel region is disposed between the first sub-channel region and the second sub-channel region.

A doping type of the first sub-channel region is different from a doping type of the second sub-channel region, and a doping type of the first sub-channel region or the second sub-channel region is identical to a doping type of the third sub-channel region; or the third sub-channel region is undoped.

According to one embodiment of the present disclosure, the display panel further includes a plurality of pixel driving circuits. Each of the pixel driving circuits includes a driving thin film transistor, a compensation thin film transistor, a switching thin film transistor, and a reset thin film transistor.

The driving thin film transistor and the switching thin film transistor are polysilicon thin film transistors, the reset thin film transistor and the compensation thin film transistor are polysilicon thin film transistors or oxide thin film transistors. All channel regions of the active layers of the compensation thin film transistor, the switching thin film transistor, and the reset thin film transistor are undoped or have identical doping ion concentration.

According to one embodiment of the present disclosure, the pixel driving circuit comprises a first switching thin film transistor, a second switching thin film transistor, a third switching thin film transistor, a compensation thin film transistor, a first reset thin film transistor, and a second reset thin film transistor.

A source region of the driving thin film transistor, a first terminal of the first switching thin film transistor and a first terminal of the second switching thin film transistor are electrically connected to a first node; and a second terminal of the first switching thin film transistor is electrically connected to a data signal line, and a second terminal of the second switching thin film transistor is electrically connected to a power supply high-voltage signal line;

a drain region of the driving thin film transistor, a first terminal of the compensation thin film transistor and a first terminal of the third switching thin film transistor are electrically connected to a second node;

a gate of the driving thin film transistor, a second terminal of the compensation thin film transistor and a first terminal of the first reset thin film transistor are electrically connected to a third node, and a second terminal of the first reset thin film transistor is electrically connected to a first initialization signal line a second terminal of the third switching thin film transistor, a first terminal of the second reset thin film transistor and an anode of the light emitting element are electrically connected to a fourth node; and a gate of the second switching thin film transistor and a gate of the third switching thin film transistor are electrically connected to a light-emitting control signal line, and a second terminal of the second reset thin film transistor is electrically connected to a second initialization signal line.

The embodiments of the present disclosure further provide a display device, including the aforementioned display panel. The embodiment of the present disclosure provides a display panel comprising a power supply high-voltage signal line, a driving thin film transistor, and a light emitting element. The driving thin film transistor comprises an active layer. The active layer includes a source region, a drain region, and a channel region. The channel region is disposed between the source region and the drain region. The source region is electrically connected to the power supply high-voltage signal line.

The drain region is electrically connected to the light emitting element. A part of the channel region close to the drain region has a lower doping ion concentration than a part of the channel region close to the source region.

According to one embodiment of the present disclosure, the channel region comprises a first sub-channel region and a second sub-channel region, and the second sub-channel region is disposed between the first sub-channel region and the drain region.

The second sub-channel region has a lower doping ion concentration than the first sub-channel region.

According to one embodiment of the present disclosure, the first sub-channel region and the second sub-channel region have a same doping type.

According to one embodiment of the present disclosure, a doping type of the first sub-channel region is different from a doping type of the second sub-channel region.

According to one embodiment of the present disclosure, the first sub-channel region is N-type doped or P-type doped, and the second sub-channel region is undoped.

According to one embodiment of the present disclosure, the doping type of the first sub-channel region is same as a doping type of the source region and the drain region, and a doping ion concentration of the first sub-channel region is less than a doping ion concentration of the source region and the drain region.

According to one embodiment of the present disclosure, a length of the first sub-channel region is greater than or equal to a length of the second sub-channel region.

According to one embodiment of the present disclosure, a width of the first sub-channel region is greater than or equal to a width of the second sub-channel region.

Advantageous Effect

The embodiments of the present disclosure provide a display panel and a display device. The display panel includes a power supply high-voltage signal line, a driving thin film transistor, and a light emitting element. The driving thin film transistor comprises an active layer that comprises a source region electrically connected to the power supply high-voltage signal line, a drain region electrically connected to the light emitting element, and a channel region disposed between the source region and the drain region. The channel region close to the drain region has a lower doping ion concentration than the channel region close to the source region. By making a part of a channel region close to a drain region have a lower majority carrier concentration than a part of the channel region close to a source region, a voltage drop of a region of a driving thin film transistor close to the drain region can be increased, and a saturation voltage of the driving thin film transistor can be reduced, thereby reducing power consumption of the driving thin film transistor, and thus reducing power consumption of the display panel.

BRIEF DESCRIPTION OF DRAWINGS

Embodiments of the present disclosure are illustrated in detail in the accompanying drawings, in which like or similar reference numerals refer to like or similar elements or elements having the same or similar functions throughout the specification. The embodiments described below with reference to the accompanying drawings are exemplary and are intended to be illustrative of the present disclosure, and are not to be construed as limiting the scope of the present disclosure.

DETAILED DESCRIPTION OF PREFERRED EMBODIMENTS

The following description of the embodiments refers to the accompanying drawings to illustrate specific embodiments in which the present application may be implemented. The directional terms, such as "upper", "lower", "front", "back", "left", "right", "inner", "outer", "side", etc., used herein only refer to the direction of the accompanying drawings. Therefore, the directional terms used are used to explain and understand the present disclosure, rather than to limit the present disclosure. In the figure, units with similar structures are represented by the same number.

The present disclosure will be further described below in conjunction with the accompanying drawings and specific embodiments.

A display panel provided by an embodiment of the present disclosure includes a power supply high-voltage signal line 20, a pixel driving circuit, a light emitting element 30, and a cathode trace 40. The pixel driving circuit is connected to the power supply high-voltage signal line 20 and the light emitting element 30. The power supply high-voltage signal line 20 is used to transmit a driving voltage VDD of a power signal of the display panel. The cathode trace 40 is used to transmit a cathode voltage VSS common to each light emitting element 30.

Figure 1:
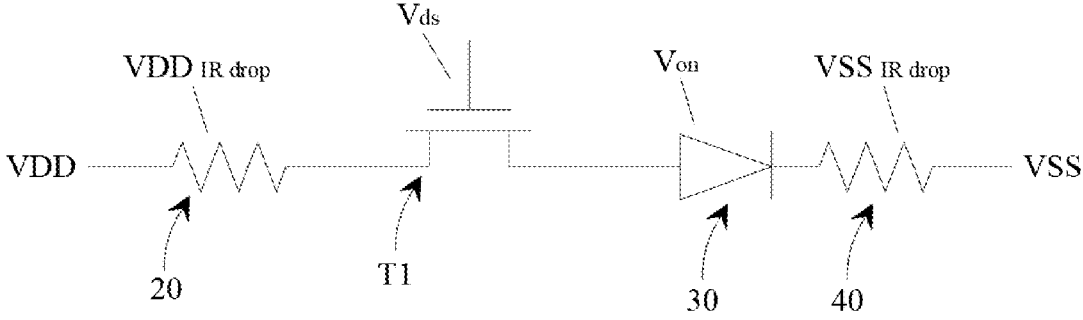
FIG. 1 is a schematic diagram of a pixel driving circuit according to an embodiment of the present disclosure.

As illustrated in FIG. 1, the pixel driving circuit may include a driving thin film transistor T1, the driving thin film transistor Tl is connected to the power supply high-voltage signal line 20 and the light emitting element 30, and the light emitting element 30 is further connected to the cathode trace 40.

In the embodiment of the present disclosure, the light emitting element 30 is an organic light-emitting diode. In some other embodiments, the light emitting element 30 may also be, but not limited to, a mini light-emitting diode (Mini LED) or a micro light-emitting diode (Micro LED) chip, which is not limited herein.

It is noted that FIG. 1 only illustrates a connection relationship between the pixel driving circuit, the power supply high-voltage signal line, and the light emitting element, and does not represent a structure of the pixel driving circuit in practical applications. The structure of the pixel driving circuit may refer to a structure of a pixel driving circuit in a current display panel, and is not limited here.

Figure 2:
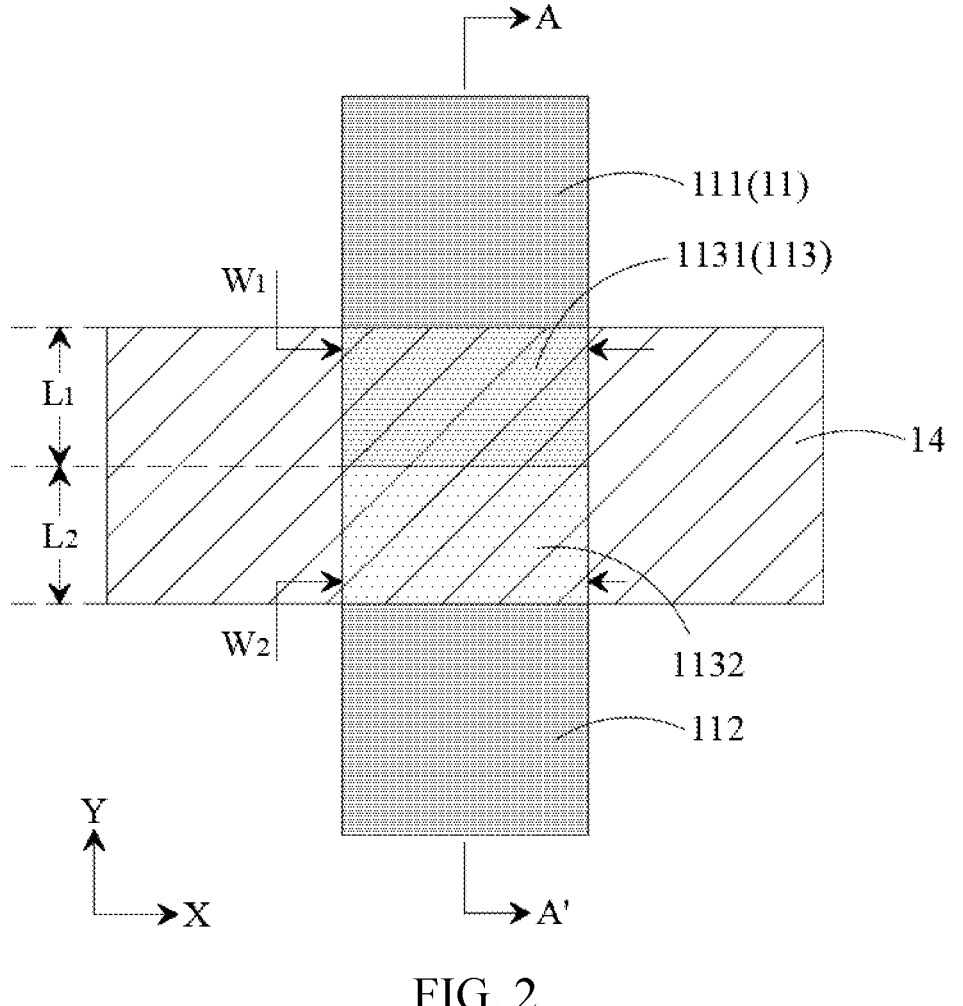
FIG. 2 is a partial schematic diagram of a first type of display panel according to an embodiment of the present disclosure.

As illustrated in FIG. 2, the driving thin film transistor Tl comprises an active layer 11, the active layer 11 may include a source region 111, a drain region 112, and a channel region 113. The channel region 113 is disposed between the source region 111 and the drain region 112, the source region 111 is connected to the power supply high-voltage signal line 20, and the drain region 112 is connected to the light emitting element 30.

It is noted that the source region 111 may be in direct contact with the power supply high-voltage signal line 20, and the source region 111 may also be in indirect contact with the power supply high-voltage signal line 20. The drain region 112 may be in direct contact with the light emitting element 30, and the drain region 112 may also be in indirect contact with the light emitting element 30.

In an embodiment of the present disclosure, the driving thin film transistor T1 is a low-temperature polysilicon thin film transistor, and a material of the active layer 11 comprises polysilicon.

Figures 3, 4:
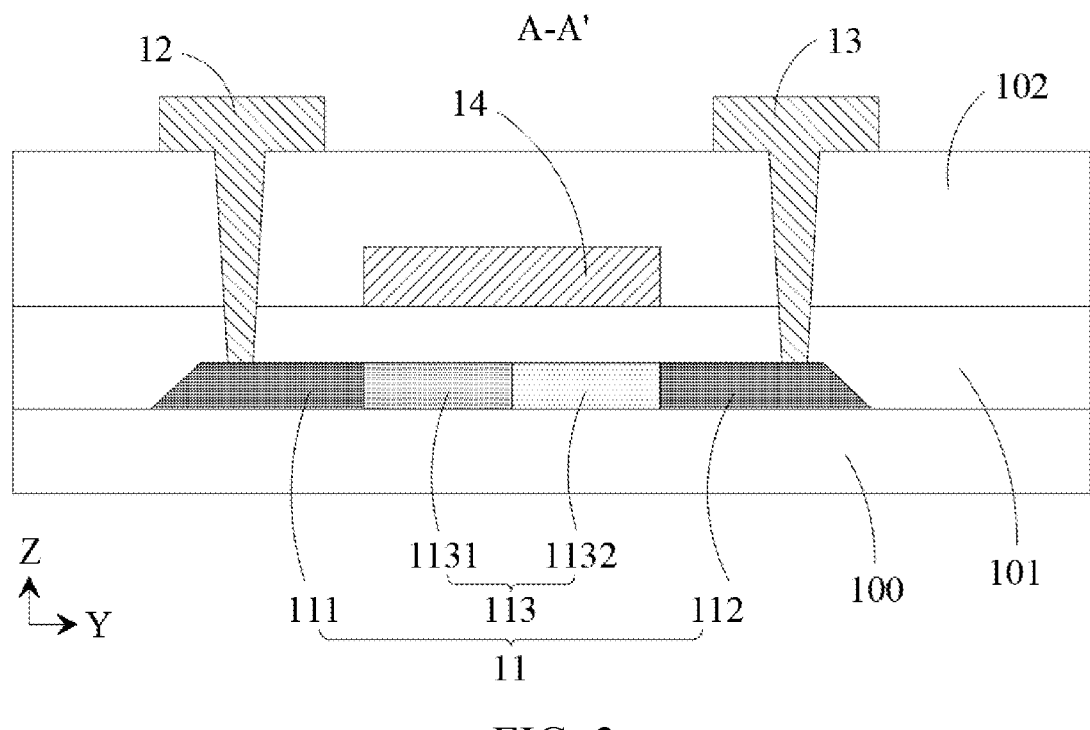
FIG. 3 is a cross-sectional view of the first type of display panel shown in FIG. 2 in an A-A' direction.
FIG. 4 is an IDVD curve diagram of a driving thin-film-transistor of the related art.

As illustrated in FIG. 3, the driving thin film transistor Tl may further include a source electrode 12 and a drain electrode 13. The source electrode 12 and the drain electrode 13 are disposed on different layers from the active layer 11, and disposed on a side of the active layer 11 away from a substrate 100.

The driving thin film transistor Tl may further include a gate electrode 14, the gate electrode 14 and the active layer 11 are disposed on different layers, and disposed on the side of the active layer 11 away from the substrate 100. An orthographic projection of the gate electrode 14 on the substrate 100 overlaps with an orthographic projection of the channel region 113 on the substrate 100.

The display panel may further include a gate insulation layer 101 and an interlayer dielectric layer 102. The gate insulation layer 101 is disposed between the active layer 11 and the gate electrode 14. The interlayer dielectric layer 102 is disposed between the source electrode 12, the drain electrode 13 and the gate electrode 14.

It is noted that FIG. 3 only illustrates a position relationship and a connection relationship between the active layer 11, the source electrode 12, the drain electrode 13, and the gate electrode 14. A layer structure of the display panel and the driving thin film transistor shown in FIG. 3 does not represent a structure of a display panel and a driving thin film transistor in practical applications. In practical applications, the driving thin film transistor is not limited to a top gate structure shown in FIG. 3, but may also be a bottom gate structure or a double gate structure, which is not limited herein.

In an embodiment of the present disclosure, a part of the channel region 113 close to the drain region 112 has a lower doping ion concentration than a part of the channel region 113 close to the source region 111.

It should be noted that power consumption of the display panel is mainly determined by a voltage difference and a current of the display panel, namely:

$$\text{Power} = (VDD - VSS) * I_{VSS};$$

where $I_{VSS}$ is a sum of operating currents of all light emitting elements, and its value is determined by a brightness setting value of the display panel and efficiency of the light emitting element. The lower the brightness of the display panel or the higher the efficiency of the light emitting element, the smaller the IVSS required, and the smaller the power consumption because:

$$VDD - VSS = VDD_{IR\ drop} + V_{ds} + V_{on} + VSS_{IR\ drop};$$

As illustrated in FIG. 1, a series of components are included between the driving voltage VDD and the cathode voltage VSS: the power high-voltage signal line 20, the driving thin film transistor T1, the light emitting element 30, and the cathode trace 40. A function of the driving thin film transistor Tl is to control a brightness of the light emitting element 30 by controlling a value of a current flowing through the driving thin film transistor T1 through the gate voltage, thereby controlling a picture and a brightness of the display panel. A voltage difference between the driving voltage VDD and the cathode voltage VSS will form voltage drops on the above four components, mainly including: a voltage drop VDD $_{IR\ drop}$ caused by a resistance of the power supply high-voltage signal line 20, a voltage drop VSS IR drop caused by a resistance of the cathode trace 40, a drain-source voltage $V_{ds}$ for operation of the thin film transistor T1, and an operating voltage $V_{on}$ required for the light emitting element 30 to emit light.

Figure 5:
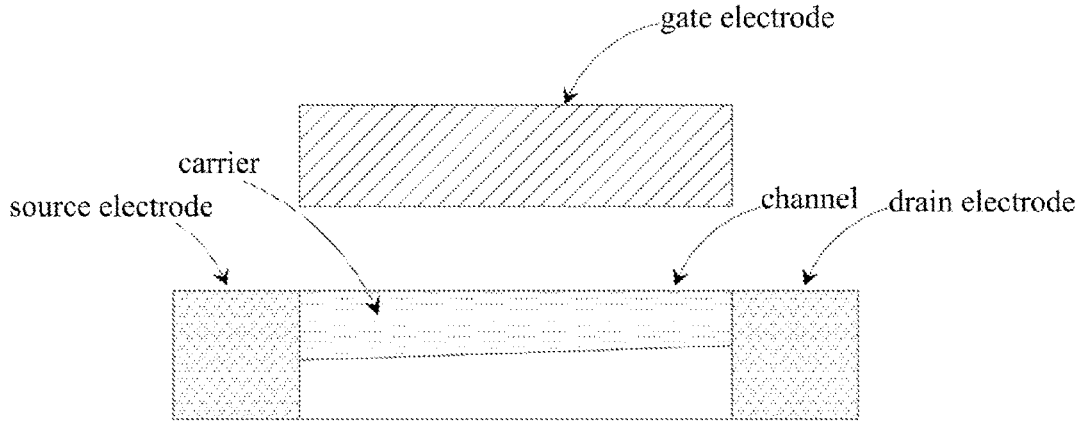
FIG. 5 is a schematic diagram of distribution of carriers in a channel when the driving thin film transistor of the related art does not enter a saturation region.

Taking a current display panel with a low-temperature polysilicon driving thin film transistor as an example, As illustrated in FIG. 4, when a drain-source voltage $V_{ds}$ of the driving thin film transistor is smaller, a drain-source current $I_{ds}$ has an approximately linear relationship with the drain-source voltage $V_{ds}$. At this time, a corresponding carrier concentration in a channel of the driving thin film transistor is distributed As illustrated in FIG. 5, and the drain-source voltage $V_{ds}$ is relatively evenly distributed throughout the channel.

Figure 6:
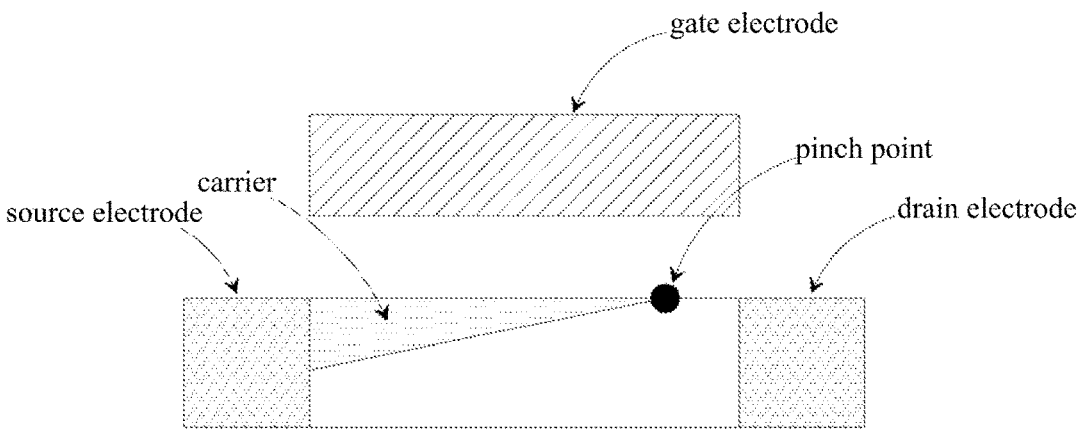
FIG. 6 is a schematic diagram of distribution of the carriers in the channel when the driving thin film transistor of the related art does not enter the saturation region.

As illustrated in FIG. 6, when the drain-source voltage $V_{ds}$ is continuously increased, and the following relationship is satisfied: $|V_{gs}-V_{th}| \geq |V_{ds}|$, a pinch point appears. That is, carriers in the part of the channel close to the drain electrode is depleted, and this part of the channel forms a high resistance region on a left side of the pinch point. There are carriers in the channel, a resistance of the channel is relatively smaller, so the drain-source voltage $V_{ds}$ voltage drop mainly occurs in the high resistance region. A drain-source voltage $V_{ds}$ corresponding to the pinch point begins to appear in the channel, which is a saturation voltage of the driving thin film transistor. At this time, the drain-source voltage $V_{ds}$ satisfies the relationship: $|V_{gs}-V_{th}| \geq |V_{ds}|$. The drain-source voltage $V_{ds}$ is continuously increased, at this time, the drain-source current $I_{ds}$ changes very little as the drain-source voltage $V_{ds}$ increases, and the driving thin film transistor enters a saturation region. When the driving thin film transistor drives a light emitting element to emit light, in order to ensure stability of an output current, the drain-source voltage $V_{ds}$ of the driving thin film transistor should be slightly greater than the saturation voltage.

The driving thin film transistor generates heat when operating, and thermal consumption of a single driving thin film transistor may be simply calculated as: $W_{DTFT}=I_{ds}*V_{ds}$. By reducing the saturation voltage of the driving thin film transistor, the drain-source voltage $V_{ds}$ of the driving thin film transistor when operating can be reduced, so as to reduce thermal consumption of the driving thin film transistor, thereby reducing power consumption of the display panel.

In an embodiment of the present disclosure, by making the part of the channel region 113 close to the drain region 112 have a lower doping ion concentration, when a drain-source voltage $V_{ds}$ is applied, the part of the channel region 113 close to the drain region 112 has a lower majority carrier concentration than the part of the channel region 113 close to the source region 111. A smaller drain-source voltage $V_{ds}$ can deplete carriers in the part of the channel region 113 close to the drain region 112, so that a pinch point occurs and the driving thin film transistor enters the saturation region.

Figure 7:
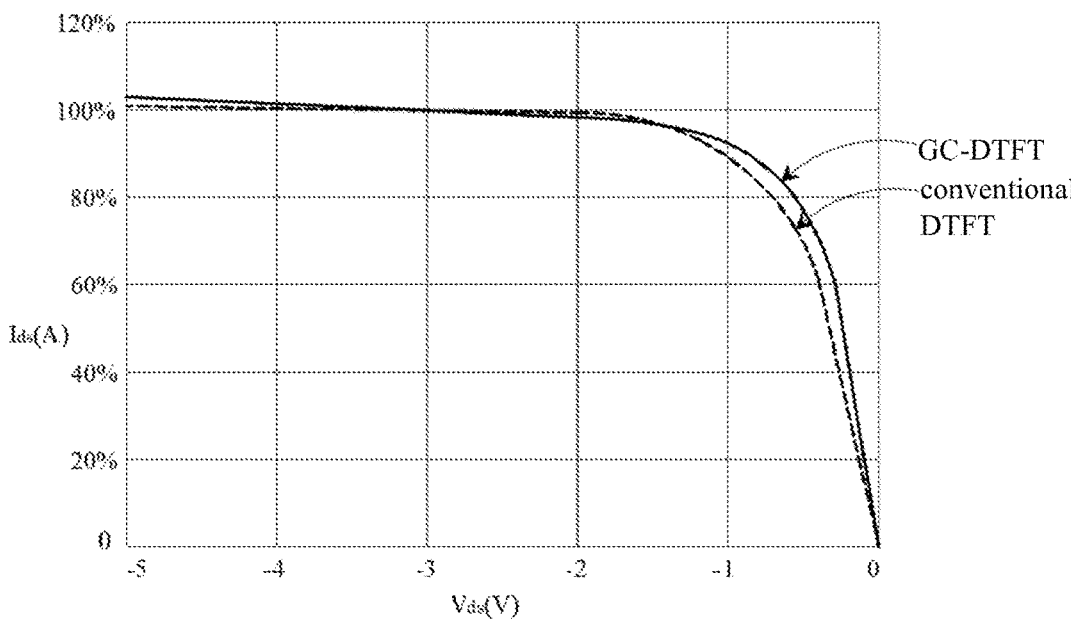
FIG. 7 is an IDVD curve diagram of a GC-DTFT provided by an embodiment of the present disclosure and a conventional DTFT.

As illustrated in FIG. 7, compared with a conventional DTFT, the driving thin film transistor in the display panel provided by the embodiment of the present disclosure is a graded channel driving thin film transistor (GD-DTFT). By making the part of the channel region 113 close to the drain region 112 have a lower majority carrier concentration, a resistance of the drain region 112 may be increased, so that a lateral voltage drop of a region of the driving thin film transistor close to the drain region 112 is larger. With a same component size, the driving thin film transistor in the embodiment of the present disclosure may have a smaller saturation voltage, thereby reducing the thermal consumption of the driving thin film transistor, and thus reducing the power consumption of the display panel.

In an embodiment of the present disclosure, the channel region 113 includes a first sub-channel region 1131 and a second sub-channel region 1132. The second sub-channel region 1132 is disposed between the first sub-channel region 1131 and the drain region 112. In a state of no applied voltage, the second sub-channel region 1132 has a lower majority carrier concentration than the first sub-channel region 1131.

As illustrated in FIG. 2, two opposite sides of the first sub-channel region 1131 are directly connected to the source region 111 and the second sub-channel region 1132, respectively. A side of the second sub-channel region 1132 away from the first sub-channel region 1131 is directly connected to the drain region 112. The orthographic projection of the gate electrode 14 on the substrate 100 overlaps with an orthographic projection of the first sub-channel region 1131 and the second sub-channel region 1132 on the substrate 100.

In one embodiment, the first sub-channel region 1131 and the second sub-channel region 1132 have a same doping type, and a doping ion concentration of the first sub-channel region 1131 is greater than a doping ion concentration of the second sub-channel region 1132.

Taking the driving thin film transistor as a P-type thin film transistor as an example, the first sub-channel region 1131 and the second sub-channel region 1132 are both P-type doped. An element doped in the first sub-channel region 1131 and the second sub-channel region 1132 may be, but is not limited to, boron. The first sub-channel region 1131 may be P-type doped with a higher concentration, and the second sub-channel region 1132 may be P-type doped with a lower concentration, so that the second sub-channel region 1132 close to the drain electrode has a lower carrier concentration. When a drain-source voltage $V_{ds}$ is applied, a smaller drain-source voltage $V_{ds}$ can deplete carriers in the second sub-channel region 1132, so that a pinch point occurs, and the driving thin film transistor enters the saturation region. Therefore, the driving thin film transistor can have a smaller saturation voltage, which can reduce the drain-source voltage $V_{ds}$ of the driving thin film transistor when operating, thereby reducing the thermal consumption of the driving thin film transistor when operating, and thus reducing the power consumption of the display panel.

The source region 111, the drain region 112, and the first sub-channel region 1131 have a same doping type, all are P-type doped, and doping ion concentrations of the source region 111 and the drain region 112 are greater than a doping ion concentration of the first sub-channel region 1131.

In a specific embodiment of the present disclosure, the source region 111, the drain region 112, and the channel region 113 are doped with boron ions. An ion doping amount of the source region 111 and the drain region 112 have an ion doping amount of $1*10^{15}/cm^2$ and a doping energy of 40 keV. An ion doping amount of the first sub-channel region 1131 have an ion doping amount of $2*10^{12}/cm^2$ and a doping energy of 10 keV. An ion doping amount of the second sub-channel region 1132 have an ion doping amount of $5*10^{11}/cm^2$ and a doping energy of 10 keV. In practical applications, the ion doping amount of the first sub-channel region 1131 is not limited to $2*10^{12}/cm^2$ in the above embodiment, it may also be $1*10^{12}/cm^2$, $1.5*10^{12}/cm^2$, $2.5*10^{12}/cm^2$, or $3*10^{12}/cm^2$, etc., and it only needs to be between $1*10^{12}/cm^2$ and $3*10^{12}/cm^2$. The ion doping amount of the second sub-channel region 1132 is not limited to $5*10^{11}/cm^2$ in the above embodiment, it may also be $1*10^{11}/cm^2$, $3*10^{11}/cm^2$, $7*10^{11}/cm^2$, or $1*10^{12}/cm^2$, etc., and it only needs to be between 0 and $1*10^{12}/cm^2$.

Taking the driving thin film transistor as an N-type thin film transistor as an example, the first sub-channel region 1131 and the second sub-channel region 1132 are both N-type doped. An element doped in the first sub-channel region 1131 and the second sub-channel region 1132 may be, but is not limited to, phosphorus and other elements. The first sub-channel region 1131 may be N-type doped with a higher concentration, and the second sub-channel region 1132 may be N-type doped with a lower concentration.

A doping type and a doping element of the source region 111 and the drain region 112 may be same as that of the first sub-channel region 1131, and doping ion concentrations of the source region 111 and the drain region 112 are greater than a doping ion concentration of the first sub-channel region 1131.

In an embodiment of the present disclosure, the first sub-channel region is N-type doped or P-type doped, and the second sub-channel region is undoped.

Taking the driving thin film transistor as a P-type thin film transistor as an example, the first sub-channel region 1131, the source region 111, and the drain region 112 have a same doping type, all are P-type doped, and the doping ion concentrations of the source region 111 and the drain region 112 are greater than the doping ion concentration of the first sub-channel region 1131. An element doped in the first sub-channel region 1131, the source region 111, and the drain region 112 may be, but is not limited to, boron and other elements. The second sub-channel region 1132 is undoped, that is, the second sub-channel region 1132 is an intrinsic semiconductor.

In a specific embodiment of the present disclosure, the source region 111, the drain region 112, and the first sub-channel region 1131 are doped with boron ions. An ion doping amount of the source region 111 and the drain region 112 have an ion doping amount of $1*10^{15}/cm^2$ and a doping energy of 40 keV. An ion doping amount of the first sub-channel region 1131 have an ion doping amount of $1*10^{12}/cm^2$ and a doping energy of 10 keV. An ion doping amount of the second sub-channel region 1132 have an ion doping amount of 0, that is, the second sub-channel region 1132 is undoped.

Taking the driving thin film transistor as a N-type thin film transistor as an example, the first sub-channel region 1131, the source region 111, and the drain region 112 have a same doping type, all are N-type doped, and the doping ion concentrations of the source region 111 and the drain region 112 are greater than the doping ion concentration of the first sub-channel region 1131. An element doped in the first sub-channel region 1131, the source region 111, and the drain region 112 may be, but is not limited to, phosphorus and other elements. The second sub-channel region 1132 is undoped, that is, the second sub-channel region 1132 is an intrinsic semiconductor.

In an embodiment of the present disclosure, the doping type of the first sub-channel region 1131 is different from the doping type of the second sub-channel region 1132.

Taking the driving thin film transistor as a P-type thin film transistor as an example, the first sub-channel region 1131, the source region 111, and the drain region 112 have a same doping type, all are P-type doped, and the doping ion concentrations of the source region 111 and the drain region 112 are greater than the doping ion concentration of the first sub-channel region 1131. The second sub-channel region 1132 is N-type doped. An element doped in the second sub-channel region 1132 may be, but is not limited to, phosphorus and other elements. The doping ion concentration of the second sub-channel region 1132 should be less than the doping ion concentration of the first sub-channel region 1131.

Taking the driving thin film transistor as a N-type thin film transistor as an example, the first sub-channel region 1131, the source region 111, and the drain region 112 have a same doping type, all are N-type doped, and the doping ion concentrations of the source region 111 and the drain region 112 are greater than the doping ion concentration of the first sub-channel region 1131. The second sub-channel region 1132 is P-type doped. An element doped in the second sub-channel region 1132 may be, but is not limited to, boron and other elements. The doping ion concentration of the second sub-channel region 1132 should be less than the doping ion concentration of the first sub-channel region 1131.

In an embodiment of the present disclosure, a length of the first sub-channel region 1131 is equal to a length of the second sub-channel region 1132.

As illustrated in FIG. 2, in a second direction Y, a length $L_1$ of the first sub-channel region 1131 is equal to a length $L_2$ of the second sub-channel region 1132.

In an embodiment of the present disclosure, the length of the first sub-channel region 1131 is greater than the length of the second sub-channel region 1132.

Figure 8:
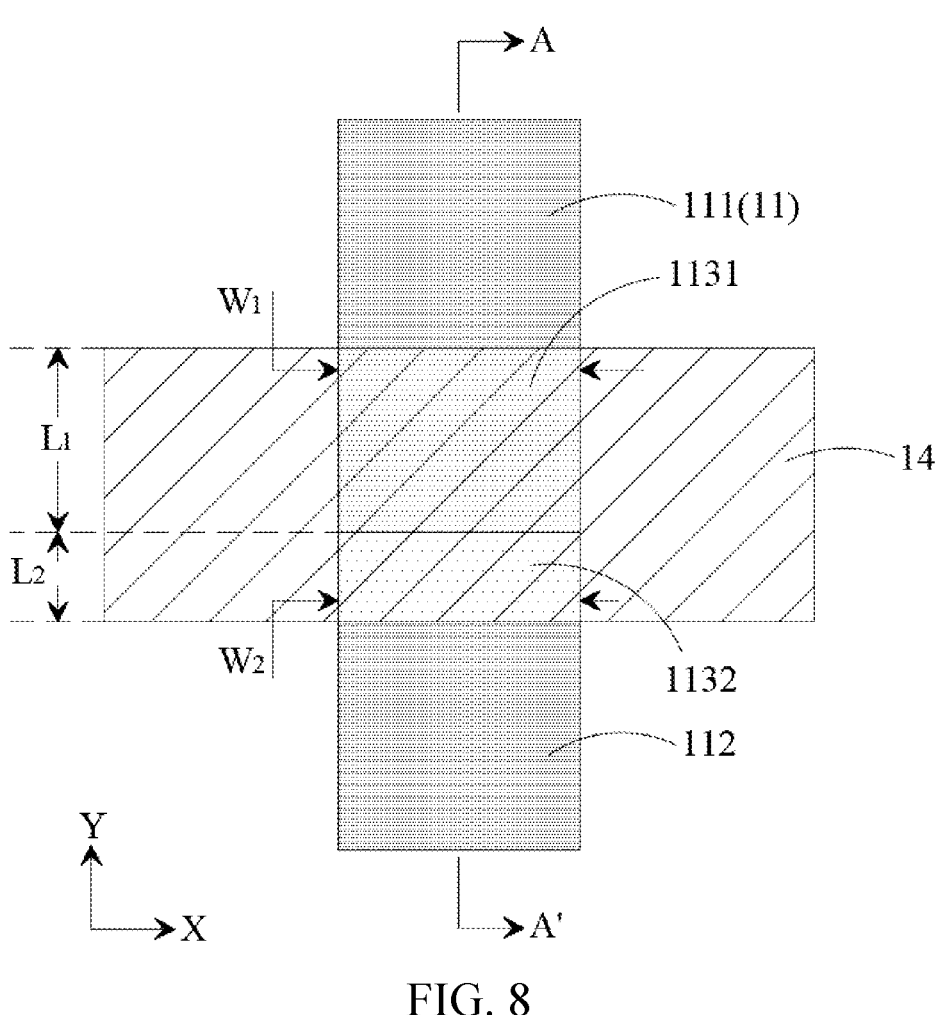
FIG. 8 is a partial schematic diagram of a second type of display panel according to an embodiment of the present disclosure.
Figure 9:
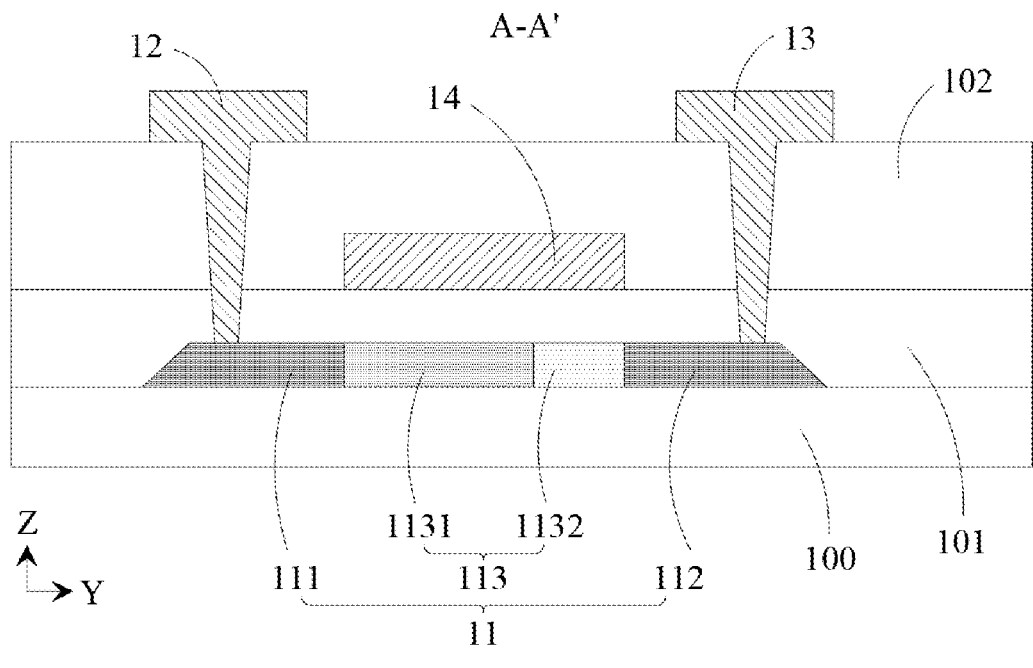
FIG. 9 a cross-sectional view of the second type of display panel shown in FIG. 8 in the A-A' direction.

As illustrated in FIG. 8 and FIG. 9, in the second direction Y, the length $L_1$ of the first sub-channel region 1131 is greater than the length $L_2$ of the second sub-channel region 1132.

It should be noted that a formula of an electric field intensity in the second sub-channel region 1132 is:

$$E_2 = \frac{V_2}{L_2} = \frac{V_{ds} * R_2}{(R_1 + R_2) * L_2} = \frac{W_2 * \rho_2 * V_{ds} * L_1}{\rho_1 * W_1 * L_2^2 + \rho_2 * W_2 * L_1 * L_2};$$

where $E_2$ is an electric field intensity in the second sub-channel region 1132, $R_1$ is a resistance of the first sub-channel region 1131, $R_2$ is a resistance of the second sub-channel region 1132, $L_1$ is a channel length of the first sub-channel region 1131, $\rho_1$ is a resistivity of the first sub-channel region 1131, and $W_1$ is a channel width of the first sub-channel region 1131, $V_2$ is a horizontal divided voltage of the second sub-channel region 1132, $L_2$ is a channel length of the second sub-channel region 1132, $W_2$ is a channel width of the second sub-channel region 1132, and $\rho_2$ is a resistivity of the second sub-channel region 1132. While keeping a length of the channel region 113 ($L_1+L_2$)

unchanged, increasing the length $L_1$ of the first sub-channel region 1131 and decreasing the length $L_2$ of the second sub-channel region 1132 can increase the electric field intensity $E_2$ in the second sub-channel region 1132.

In an embodiment of the present disclosure, the width of the first sub-channel region 1131 is equal to the width of the second sub-channel region 1132.

As illustrated in FIG. 2 or FIG. 4, in a first direction X, the width $W_1$ of the first sub-channel region 1131 is equal to the width $W_2$ of the second sub-channel region 1132. The first direction X is perpendicular to the second direction Y, and a third direction Z is perpendicular to the first direction X and the second direction Y. In some other embodiments, the first direction X intersects with the second direction Y, but is not perpendicular, and is not limited herein.

In one embodiment, the width of the first sub-channel region 1131 is greater than the width of the second sub-channel region 1132.

Figure 10:
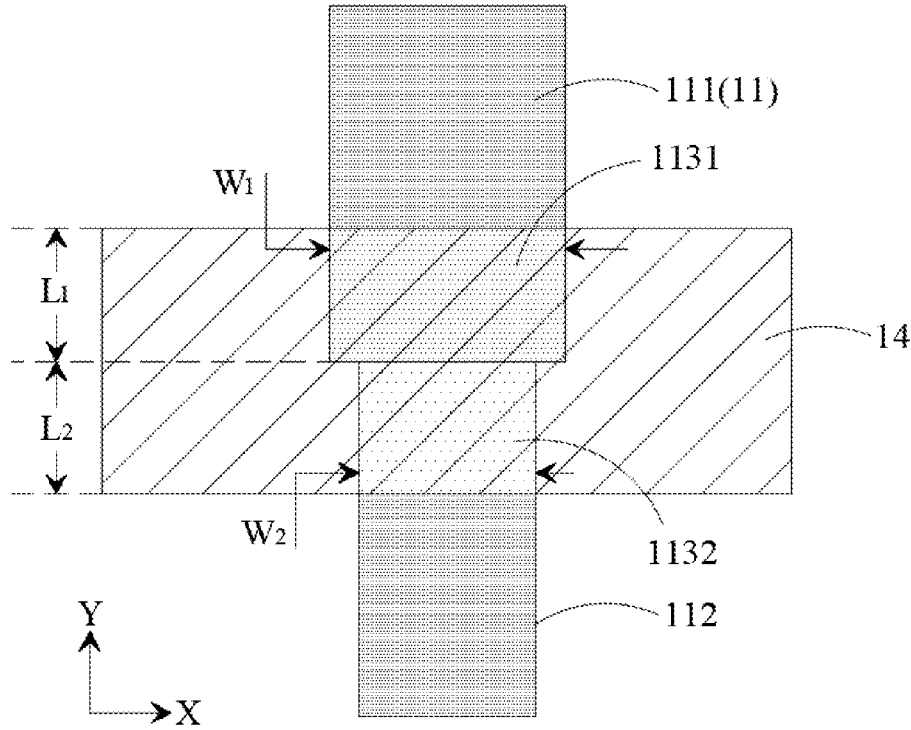
FIG. 10 is a partial schematic diagram of a third type of display panel according to an embodiment of the present disclosure.

As illustrated in FIG. 10, in the first direction X, the width $W_1$ of the first sub-channel region 1131 is greater than the width $W_2$ of the second sub-channel region 1132. In the second direction Y, the length $L_1$ of the first sub-channel region 1131 is equal to the length $L_2$ of the second sub-channel region 1132.

It should be noted that the resistance $R_1$ of the first sub-channel region 1131 is inversely proportional to the width $W_1$ of the first sub-channel region 1131, and the resistance $R_2$ of the second sub-channel region 1132 is also inversely proportional to the width $W_2$ of the second sub-channel region 1132. Increasing the width $W_1$ of the first sub-channel region 1131 can reduce the resistance $R_1$ of the first sub-channel region 1131, and reducing the width $W_2$ of the second sub-channel region 1132, can increase the resistance $R_2$ of the second sub-channel region 1132. Combined with the above formula of the electric field intensity $E_2$ in the second sub-channel region 1132, it can be known that reducing the resistance $R_1$ of the first sub-channel region 1131 and increasing the resistance $R_2$ of the second sub-channel region 1132 can increase the electric field intensity $E_2$ in the second sub-channel region 1132.

Figure 11:
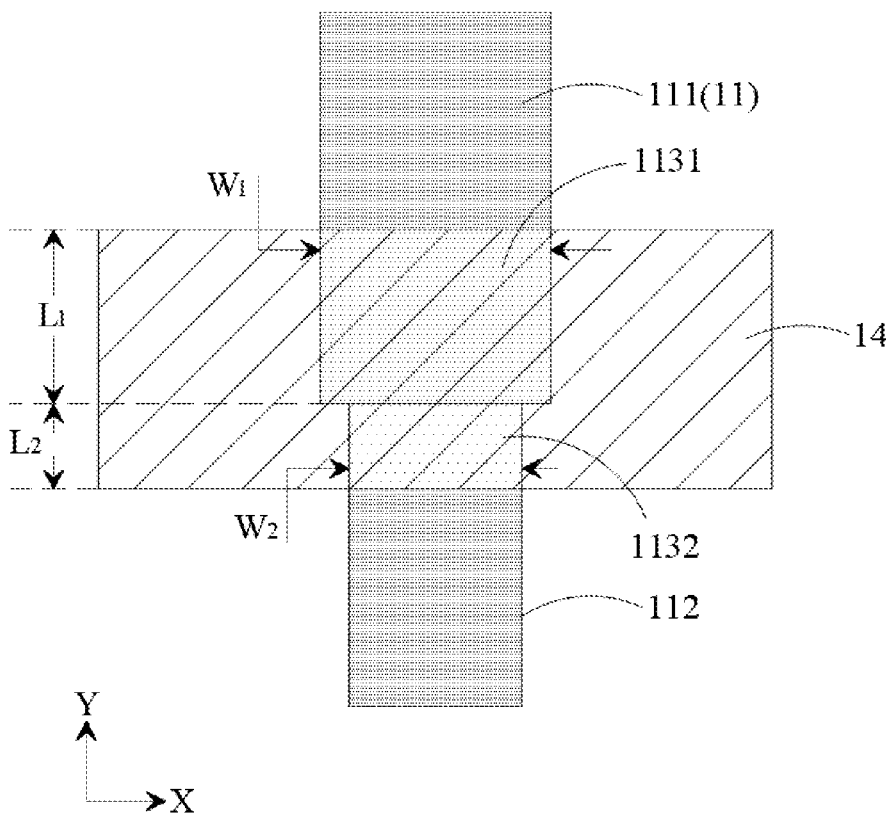
FIG. 11 is a partial schematic diagram of a fourth type of display panel according to an embodiment of the present disclosure.

In an embodiment of the present disclosure, as illustrated in FIG. 11, in the second direction Y, the length $L_1$ of the first sub-channel region 1131 is equal to the length $L_2$ of the second sub-channel region 1132, and in the first direction X, the width $W_1$ of the first sub-channel region 1131 is greater than the width $W_2$ of the second sub-channel region 1132, which also allows the part of the channel region 113 close to the drain electrode to have a lower carrier concentration, thereby reducing the saturation voltage of the driving thin film transistor, reducing the thermal consumption of the driving thin film transistor, and thus reducing the power consumption of the display panel.

In an embodiment of the present disclosure, the channel region 113 may further include a third sub-channel region 1133, and the third sub-channel region 1133 is disposed between the first sub-channel region 1131 and the second sub-channel region 1132.

Figure 12:
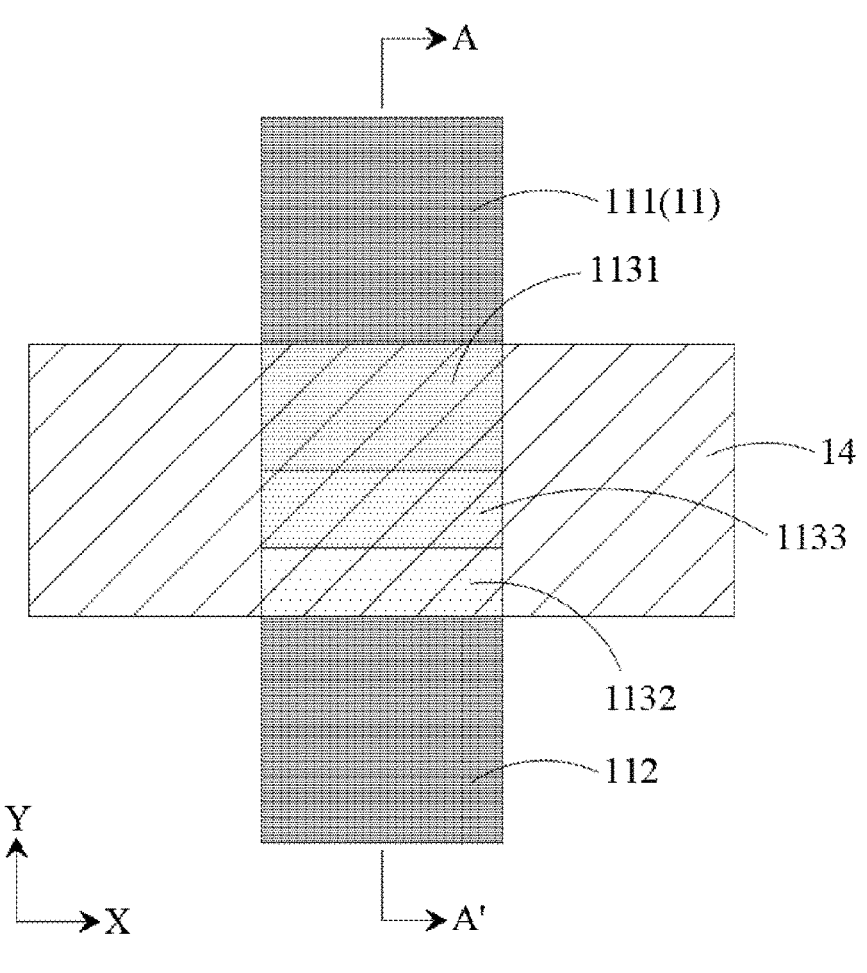
FIG. 12 is a partial schematic diagram of a fifth type of display panel according to an embodiment of the present disclosure.

As illustrated in FIG. 12, the two opposite sides of the first sub-channel region 1131 are directly connected to the source region 111 and the third sub-channel region 1133, respectively, and the two opposite sides of the second sub-channel region 1132 are directly connected to the third sub-channel region 1133 and the drain region 112, respectively.

Figure 13:
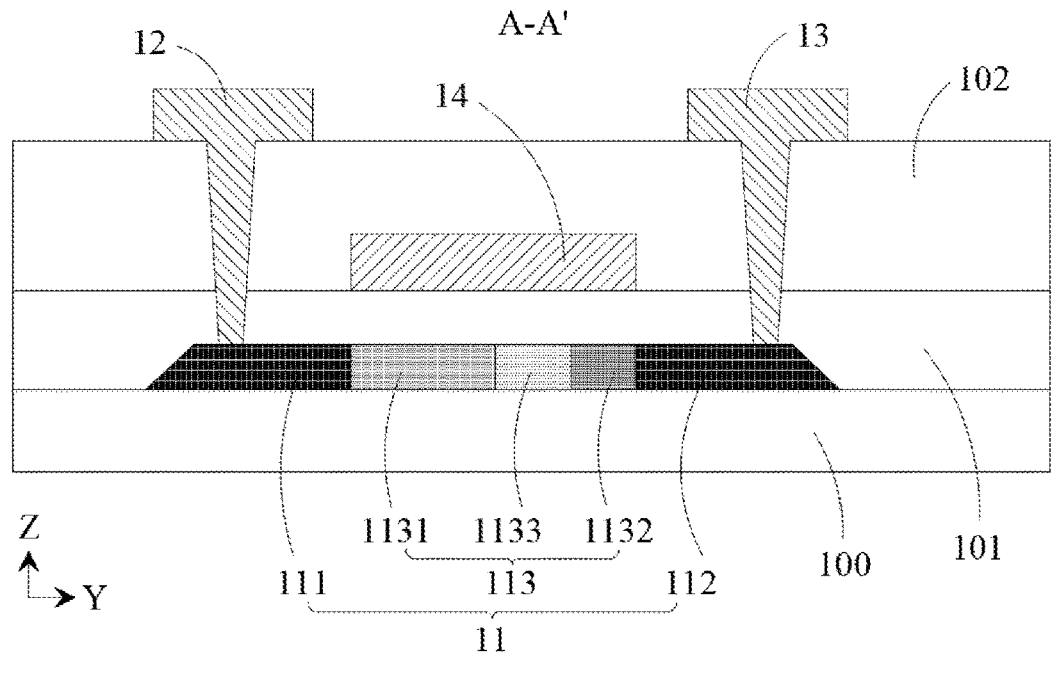
FIG. 13 is a cross-sectional view of the fifth type of display panel shown in FIG. 12 in the A-A' direction.

As illustrated in FIG. 13, the orthographic projection of the gate electrode 14 on the substrate 100 may overlap with an orthographic projection of the first sub-channel region 1131, the second sub-channel region 1132, and the third sub-channel region 1133 on the substrate 100.

In an embodiment of the present disclosure, the first sub-channel region 1131, the second sub-channel region 1132, and the third sub-channel region 1133 have a same doping type. A doping ion concentration of the first sub-channel region 1131 is greater than a doping ion concentration of the third sub-channel region 1133, and the doping ion concentration of the third sub-channel region 1133 is greater than a doping ion concentration of the second sub-channel region 1132. In this structure, the part of the channel region 113 close to the drain electrode may have a lower carrier concentration, thereby reducing the saturation voltage of the driving thin film transistor, reducing the thermal consumption of the driving thin film transistor, and thus reducing the power consumption of the display panel.

Taking the driving thin film transistor as a P-type thin film transistor as an example, the doping types of the first sub-channel region 1131, the second sub-channel region 1132, and the third sub-channel region 1133 are all P-type doping. The doping ion concentration of the first sub-channel region 1131 is greater than the doping ion concentration of the third sub-channel region 1133, and the doping ion concentration of the third sub-channel region 1133 is greater than the doping ion concentration of the second sub-channel region 1132, gradually decreasing. The source region 111 and the drain region 112 are also P-type doped, and the doping ion concentration of the first sub-channel region 1131 should be less than the doping ion concentrations of the source region 111 and the drain region 112.

Taking the driving thin film transistor as a N-type thin film transistor as an example, the doping types of the first sub-channel region 1131, the second sub-channel region 1132, and the third sub-channel region 1133 are all N-type doping. The doping ion concentration of the first sub-channel region 1131 is greater than the doping ion concentration of the third sub-channel region 1133, and the doping ion concentration of the third sub-channel region 1133 is greater than the doping ion concentration of the second sub-channel region 1132, gradually decreasing. The source region 111 and the drain region 112 are also N-type doped, and the doping ion concentration of the first sub-channel region 1131 should be less than the doping ion concentrations of the source region 111 and the drain region 112.

In one embodiment, the first sub-channel region 1131 and the second sub-channel region 1132 have different doping types. The third sub-channel region 1133 has a same doping type as one of the first sub-channel region 1131 and the second sub-channel region 1132, or the third sub-channel region 1133 is undoped.

Taking the driving thin film transistor as a P-type thin film transistor as an example, the doping types of the first sub-channel region 1131, the source region 111, and the drain region 112 are P-type doping. The doping ion concentration of the first sub-channel region 1131 should be less than the doping ion concentrations of the source region 111 and the drain region 112. The doping type of the second sub-channel region 1132 is N-type doping. The doping type of the third sub-channel region 1133 may be P-type doping or N-type doping. The third sub-channel region 1133 may also not be doped. In this way, the part of the channel region 113 close to the drain electrode may have a lower carrier concentration, thereby reducing the saturation voltage of the driving thin film transistor, reducing the thermal consumption of the driving thin film transistor, and thus reducing the power consumption of the display panel.

Taking the driving thin film transistor as an N-type thin film transistor as an example, the first sub-channel region 1131 is N-type doped, the second sub-channel region 1132 is N-type doped, the third sub-channel region 1133 may be P-type doped or N-type doped, and the third sub-channel region 1133 may also be not doped.

In an embodiment of the present disclosure, the lengths of the first sub-channel region 1131, the second sub-channel region 1132, and the third sub-channel region 1133 in the second direction Y may be equal, or may gradually decrease. The widths of the first sub-channel region 1131, the second sub-channel region 1132, and the third sub-channel region 1133 in the first direction X may be equal, or may gradually decrease, which is not limited herein.

It is noted that the embodiments of the present disclosure only illustrate that the channel region 113 of the active layer 11 is divided into two or three sub-channel regions with different doping ion concentrations or doping types. In practical applications, the channel region 113 is also divided into three or more sub-channel regions. A doping type of each of the sub-channel regions, a relationship between doping ion concentrations of the sub-channel regions, and a relationship between lengths or widths of the sub-channel regions can refer to the above embodiments, and will not be described in detail herein.

Furthermore, the display panel comprises a plurality of pixel driving circuits, and the pixel driving circuits comprise the driving thin film transistors, compensation thin film transistors, switching thin film transistors, and reset thin film transistors.

In an embodiment of the present disclosure, the display panel may include one or more switching thin film transistors. The driving thin film transistor and the switching thin film transistor are polysilicon thin film transistors. Since the switching thin film transistor only functions as a switch and has no power consumption, a channel region of an active layer of the switching thin film transistor may be doped or undoped. When the channel region of the switching thin film transistor is doped, all parts of the channel region of the active layer of the switching thin film transistor have a same doping ion concentration, and there is no need to differentiate doping ion concentrations of different parts of the channel region of the active layer of the switching thin film transistor.

The reset thin film transistor may be a polysilicon thin film transistor or an oxide thin film transistor. When the reset thin film transistor is a polysilicon thin film transistor, a channel region of the reset thin film transistor may be doped or undoped. When the channel region of the reset thin film transistor is doped, all parts of the channel region of an active layer of the reset thin film transistor have a same doping ion concentration. When the reset thin film transistor is an oxide thin film transistor, the channel region of the reset thin film transistor is undoped.

The compensation thin film transistor may also be a polysilicon thin film transistor or an oxide thin film transistor. When the compensation thin film transistor is a polysilicon thin film transistor, a channel region of the compensation thin film transistor may be doped or undoped. When the channel region of the compensation thin film transistor is doped, a doping ion concentration of each part of the channel region of an active layer of the compensation thin film transistor is consistent. When the compensation film transistor is an oxide thin film transistor, the channel region of the compensation thin film transistor is undoped.

Figure 14:
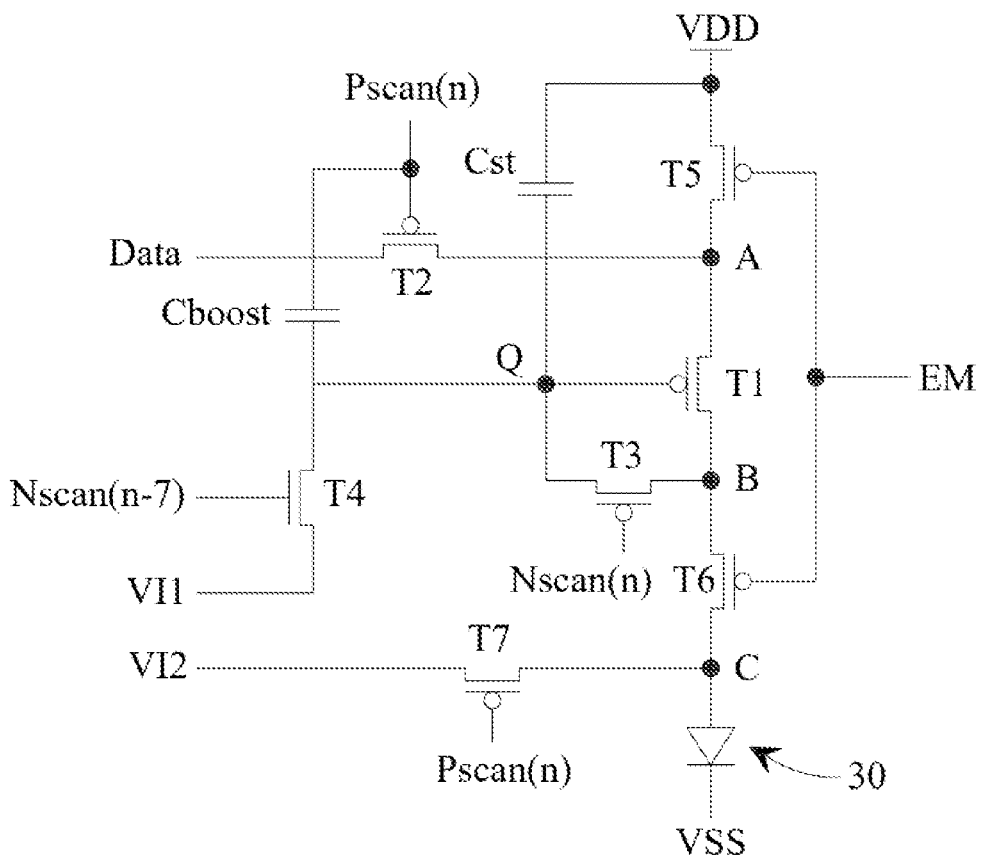
FIG. 14 is a pixel driving circuit diagram provided by an embodiment of the present disclosure.

In an embodiment of the present disclosure, as illustrated in FIG. 14, a pixel driving circuit comprises a driving thin film transistor T1, a first switching thin film transistor T2, a second switching thin film transistor T5, a third switching thin film transistor T6, a compensation thin film transistor T3, a first reset thin film transistor T4, a second reset thin film transistor T7, a storage capacitor Cst, and a bootstrap capacitor Cboost. The driving thin film transistor T1 and the first switching thin film transistor T2, the second switching thin film transistor T5, the third switching thin film transistor T6, and the second reset thin film transistor T7 are all P-type polysilicon thin film transistors. The compensation thin film transistor T3 and the first reset thin film transistor T4 are N-type oxide thin film transistors. Channel regions of active layers of the first switching thin film transistor T2, the second switching thin film transistor T5, the third switching thin film transistor T6, and the second reset thin film transistor T7 are all doped and have a same doping ion concentration. Channel regions of active layers of the compensation thin film transistor T3 and the first reset thin film transistor T4 are not doped.

The source region 111 or the source electrode 12 of the driving thin film transistor T1 is electrically connected to a first terminal of the first switching thin film transistor T2 and a first terminal of the second switching thin film transistor T5 at a first node A. A second terminal of the first switching thin film transistor T2 is electrically connected to a data signal line Data. A second terminal of the second switching thin film transistor T5 and a first electrode plate of the storage capacitor Cst are electrically connected to a power high-voltage signal line used to transmit a driving voltage VDD. A gate electrode of the first switching thin film transistor T2 and a first electrode plate of the bootstrap capacitor Cboost are electrically connected to a first scanning signal line Pscan(n).

The drain region 112 or the drain electrode 13 of the driving thin film transistor T1 is electrically connected to a first terminal of the compensation thin film transistor T3 and a first terminal of the third switching thin film transistor T6 at a second node B. The gate electrode of the driving thin film transistor T1 is electrically connected to a second terminal of the compensation thin film transistor T3, a first terminal of the first reset thin film transistor T4, a second electrode plate of the bootstrap capacitor Cboost, and a second electrode plate of the storage capacitor Cst at a third node Q. A second terminal of the first reset thin film transistor T4 is electrically connected to a first initialization signal line VI1. A gate electrode of the first reset thin film transistor T4 is electrically connected to a second scanning signal line Nscan(n-7). A gate electrode of the compensation thin film transistor T3 is connected to a third scanning signal line Nscan(n).

A second terminal of the third switching thin film transistor T6 is electrically connected to a first terminal of the second reset thin film transistor T7 and an anode electrode of the light emitting element 30 at a fourth node C. A cathode electrode of the light emitting element 30 is connected to a power supply low-voltage signal line used to transmit a cathode voltage VSS. Gate electrodes of the second switching thin film transistor T5 and the third switching thin film transistor T6 are electrically connected to a light-emitting control signal line EM. A second terminal of the second reset thin film transistor T7 is electrically connected to a second initialization signal line VI2. A gate electrode of the second reset thin film transistor T7 is electrically connected to the first scanning signal line Pscan(n).

It is noted that the first terminal of each of the above thin film transistors may refer to one of the source and the drain of the thin film transistor, and the second terminal may refer to the other of the source and the drain of the thin film transistor.

It is also noted that the compensation thin film transistor T3 and the first reset thin film transistor T4 in the embodiment shown in FIG. 14 may also be P-type polysilicon thin film transistors. FIG. 14 only illustrates a position of the driving thin film transistor T1 in the pixel driving circuit and its connection relationship with other switching thin film transistors, reset thin film transistors, and compensation thin film transistors in the embodiment of the present disclosure, and does not represent a circuit structure of the pixel driving circuit in practical applications. The driving thin film transistor T1 may be applied to a pixel driving circuit of a current OLED display panel, which is not limited herein.

Beneficial effect of the embodiments of the present disclosure: the embodiments of the present disclosure provide a display panel. The display panel includes a power supply high-voltage signal line, a driving thin film transistor, and a light emitting element. The driving thin film transistor comprises an active layer that comprises a source region electrically connected to the power supply high-voltage signal line, a drain region electrically connected to the light emitting element, and a channel region disposed between the source region and the drain region. The channel region close to the drain region has a lower doping ion concentration than the channel region close to the source region. By making a part of a channel region close to a drain region have a lower majority carrier concentration than a part of the channel region close to a source region, a voltage drop of a region of a driving thin film transistor close to the drain region can be increased, and a saturation voltage of the driving thin film transistor can be reduced, thereby reducing power consumption of the driving thin film transistor, and thus reducing power consumption of the display panel.

According to the display panel provided by the above embodiments of the present disclosure, the embodiments of the present disclosure further provide a display device including a motherboard, a frame, and a display panel. The motherboard is disposed within the frame. The display panel is fixed on the frame. The motherboard is electrically connected to the display panel. The display panel of the display device may be the display panel provided in any of the above embodiments. A structure of the display panel will not be described in detail herein.

In summary, although the present disclosure is disclosed above by preferred embodiments, but the above preferred embodiments are not used to limit the present disclosure. One of ordinary skills in the art, without departing from the scope of the present disclosure, can make various changes and modifications, so the scope of protection of the present disclosure is based on the scope defined by the claims.

What is claimed is:

1. A display panel, comprising a power supply high-voltage signal line, a driving thin film transistor, and a light emitting element, wherein the driving thin film transistor comprises an active layer that comprises a source region electrically connected to the power supply high-voltage signal line, a drain region electrically connected to the light emitting element, and a channel region disposed between the source region and the drain region;

wherein the channel region close to the drain region has a lower doping ion concentration than the channel region close to the source region.

2. The display panel according to claim 1, wherein the channel region comprises a first sub-channel region and a second sub-channel region, and the second sub-channel region is disposed between the first sub-channel region and the drain region;

wherein the second sub-channel region has a lower doping ion concentration than the first sub-channel region.

3. The display panel according to claim 2, wherein the first sub-channel region and the second sub-channel region have a same doping type.

4. The display panel according to claim 3, wherein the doping type of the first sub-channel region is same as a doping type of the source region and the drain region, and a doping ion concentration of the first sub-channel region is less than a doping ion concentration of the source region and the drain region.

5. The display panel according to claim 2, wherein a doping type of the first sub-channel region is different from a doping type of the second sub-channel region.

6. The display panel according to claim 2, wherein the first sub-channel region is N-type doped or P-type doped, and the second sub-channel region is undoped.

7. The display panel according to claim 2, wherein a length of the first sub-channel region is greater than or equal to a length of the second sub-channel region.

8. The display panel according to claim 2, wherein a width of the first sub-channel region is greater than or equal to a width of the second sub-channel region.

9. The display panel according to claim 2, wherein the channel region further comprises a third sub-channel region, and the third sub-channel region is disposed between the first sub-channel region and the second sub-channel region;

wherein the first sub-channel region, the second sub-channel region, and the third sub-channel region have a same doping type, a doping ion concentration of the first sub-channel region is greater than a doping ion concentration of the third sub-channel region, and the doping ion concentration of the third sub-channel region is greater than the doping ion concentration of the second sub-channel region.

10. The display panel according to claim 2, wherein the channel region further comprises a third sub-channel region, and the third sub-channel region is disposed between the first sub-channel region and the second sub-channel region;

wherein a doping type of the first sub-channel region is different from a doping type of the second sub-channel region, and a doping type of the first sub-channel region or the second sub-channel region is identical to a doping type of the third sub-channel region; or the third sub-channel region is undoped.

11. The display panel according to claim 1, further comprising a plurality of pixel driving circuits, each of the pixel driving circuits comprising a driving thin film transistor, a compensation thin film transistor, a switching thin film transistor, and a reset thin film transistor, wherein the driving thin film transistor and the switching thin film transistor are polysilicon thin film transistors, the reset thin film transistor and the compensation thin film transistor are polysilicon thin film transistors or oxide thin film transistors; and all channel regions of the active layers of the compensation thin film transistor, the switching thin film transistor, and the reset thin film transistor are undoped or have identical doping ion concentration.

12. The display panel according to claim 11, wherein the pixel driving circuit comprises a first switching thin film transistor, a second switching thin film transistor, a third switching thin film transistor, a compensation thin film transistor, a first reset thin film transistor, and a second reset thin film transistor;

wherein a source region of the driving thin film transistor, a first terminal of the first switching thin film transistor and a first terminal of the second switching thin film transistor are electrically connected to a first node; and a second terminal of the first switching thin film transistor is electrically connected to a data signal line, and a second terminal of the second switching thin film transistor is electrically connected to the power supply high-voltage signal line;

a drain region of the driving thin film transistor, a first terminal of the compensation thin film transistor and a first terminal of the third switching thin film transistor are electrically connected to a second node;

a gate of the driving thin film transistor, a second terminal of the compensation thin film transistor and a first terminal of the first reset thin film transistor are electrically connected to a third node, and a second terminal of the first reset thin film transistor is electrically connected to a first initialization signal line; and a second terminal of the third switching thin film transistor, a first terminal of the second reset thin film transistor and an anode of the light emitting element are electrically connected to a fourth node; and a gate of the second switching thin film transistor and a gate of the third switching thin film transistor are electrically connected to a light-emitting control signal line, and a second terminal of the second reset thin film transistor is electrically connected to a second initialization signal line.

13. A display device comprising a display panel that comprises a power supply high-voltage signal line, a driving thin film transistor, and a light emitting element, wherein the driving thin film transistor comprises an active layer that comprises a source region electrically connected to the power supply high-voltage signal line, a drain region electrically connected to the light emitting element, and a channel region disposed between the source region and the drain region;

wherein the channel region close to the drain region has a lower doping ion concentration than the channel region close to the source region.

14. The display device according to claim 13, wherein the channel region comprises a first sub-channel region and a second sub-channel region, and the second sub-channel region is disposed between the first sub-channel region and the drain region;

wherein the second sub-channel region has a lower doping ion concentration than the first sub-channel region.

15. The display device according to claim 14, wherein the first sub-channel region and the second sub-channel region have a same doping type.

16. The display device according to claim 15, wherein the doping type of the first sub-channel region is same as a doping type of the source region and the drain region, and a doping ion concentration of the first sub-channel region is less than a doping ion concentration of the source region and the drain region.

17. The display device according to claim 14, wherein a doping type of the first sub-channel region is different from a doping type of the second sub-channel region.

18. The display device according to claim 14, wherein the first sub-channel region is N-type doped or P-type doped, and the second sub-channel region is undoped.

19. The display device according to claim 14, wherein a length of the first sub-channel region is greater than or equal to a length of the second sub-channel region.

20. The display device according to claim 14, wherein a width of the first sub-channel region is greater than or equal to a width of the second sub-channel region.

* * * * *